United States Patent [19]

Grossmann et al.

[11] Patent Number: 4,638,404
[45] Date of Patent: Jan. 20, 1987

[54] CLAMPING DEVICE FOR PLATE-SHAPED SEMICONDUCTOR COMPONENTS

[75] Inventors: Kurt Grossmann, Hallerndorf; Jurgen Bliesner, Hemhofen; Joachim Schikor, Uttenreuth, all of Fed. Rep. of Germany

[73] Assignee: Siemens Aktiengesellschaft, Munich, Fed. Rep. of Germany

[21] Appl. No.: 483,734

[22] Filed: Apr. 11, 1983

[30] Foreign Application Priority Data

Apr. 23, 1982 [DE] Fed. Rep. of Germany ....... 3215192

[51] Int. Cl.⁴ .............................................. H05K 7/20
[52] U.S. Cl. .................... 361/388; 165/80.3; 165/185; 174/16 HS; 357/79; 357/81; 361/386
[58] Field of Search ..................... 165/80.1, 80.2, 80.3, 165/185; 174/16 HS; 357/80, 81, 79; 361/386, 387, 388, 389

[56] References Cited

U.S. PATENT DOCUMENTS

| 3,315,136 | 4/1967 | Lob | 357/79 |
|---|---|---|---|
| 3,366,171 | 1/1968 | Scharli | 361/388 |
| 3,735,206 | 5/1973 | Pesek | 361/386 |
| 4,459,639 | 6/1984 | Heil et al. | 361/388 |
| 4,521,829 | 6/1985 | Wessely | 361/387 |

FOREIGN PATENT DOCUMENTS 0997140 2/1983 U.S.S.R. ................................ 357/81

Primary Examiner—A. D. Pellinen
Assistant Examiner—Gregory D. Thompson
Attorney, Agent, or Firm—Kenyon & Kenyon

[57] ABSTRACT

A device which clamps a plurality of plate-shaped semiconductor components to a heat sink provided with a recess having a plurality of walls formed by respective inner faces of the heat sink comprises a pressure element disposed in the recess. Lateral surfaces of the pressure element are oriented parallel to the wall of the recess and the semiconductor components are sandwiched between the lateral surfaces of the pressure element and the recess walls. A clamping element engages the end faces of the pressure element. Upon the compressing of the pressure element by the clamping element, the lateral surfaces of the pressure element are forced laterally outwardly and perpendicularly to the recess walls, whereby the semiconductor components are pressed against the walls of the recess. The pressure element advantageously consists of elastically compressible material or may be composed of two wedges which can be moved relative to each other.

6 Claims, 7 Drawing Figures

CLAMPING DEVICE FOR PLATE-SHAPED SEMICONDUCTOR COMPONENTS

BACKGROUND OF THE INVENTION

This invention relates to a clamping device for pressing several plate-shaped semiconductor components against a heat sink.

Such a clamping device is described in German Open Application (Deutsche Offenlegungsschrift) No. 29 26 403.

In the cooling of semiconductor components, good heat transfer between the semiconductor components and a heat sink is of decisive importance. In order to keep the heat transfer resistance low, the semiconductor components are generally pressed against the heat sink. This can be done, for instance, by bolting the semiconductor components directly to the heat sink by means of projecting tabs. In general, electrical contact as well as thermal contact is established between the semiconductor components and the heat sink. By directly bolting the semiconductor components to the heat sink, however, no uniform contact pressure is obtained, with the result that heat dissipation by such an arrangement is limited. Furthermore, the screw connection of each individual semiconductor component in the assembly is relatively cumbersome.

The above-mentioned German application discloses a clamping device, especially for disc-shaped thyristors for facilitating the dissipation of greater amounts of heat energy, wherein a semiconductor component rests against a heat sink at least on one side. Two clamping bolts are provided, between which a leaf spring is arranged. With this leaf spring, the semiconductor component is pressed against the heat sink, a contact piece being arranged between the leaf spring and the semiconductor component for uniform pressure distribution. With this clamping device, very uniform pressure of the semiconductor component against the heat sink is achieved, and also large contact pressures can be realized. Several series-connected semiconductor components can be stacked up and provided with a common clamping device. For independent or parallel-connected semiconductor components, however, a separate clamping device must be provided for each element. Because of the high cost of the clamping device as well as the cumbersome assembly, such a device is of interest only for high power chips.

An object of the present invention is to provide an improved clamping device of the above-described type wherein manufacturing of the device and installation of the semiconductor components are simplified. Another object of the present invention is to provide such a clamping device wherein several semiconductor components connected independently of or parallel to each other can be installed in a common clamping device in a space-saving manner.

SUMMARY OF THE INVENTION

According to this invention, these objects are achieved by providing the heat sink with a recess; disposing in this recess a deformable pressure element having lateral surfaces parallel to the walls of the recess; pressing the end faces of the pressure element together by a clamping element, whereby the pressure element expands perpendicularly to the walls of the recess; and disposing the plate-shaped semiconductor components between the lateral surfaces of the pressure element and the walls of the recess.

In this clamping device, a multiplicity of semiconductor components are accomodated in a recess of the heat sink, which accomodation is an efficient use of space. If the heat sink is, or instance, air-cooled, the heat transfer surfaces of the heat sink are not decreased in their collective area by the installation of the semiconductor components, so that the assembly space otherwise available for the semiconductor components is saved. The semiconductor components are pressed by the pressure element against the walls of the recess. It is thereby ensured that the contact pressure is uniformly distributed over all semiconductor components. If, on the one hand, an insulating foil is inserted between the semiconductor components and the walls of the recess, then the semiconductor components can be connected completely independently of each other even if their casings are connected to terminals of the semiconductor components. If, on the other hand, no insulating foil is inserted between the semiconductor components and the heat sink, an electrical contact between the semiconductor components and the heat sink is established simulataneously with the thermal contact, so that all casings of the built-in semiconductor components are connected to each other. This facilitates, for instance, connecting the semiconductor components in parallel.

The pressure element advantageously consists of elastically compressible material. In this case the contact pressure is distributed particularly uniformly over the contact surfaces and manufacturing tolerances are equalized.

The recess and the pressure element each may have the form of a regular right prism, a semiconductor component advantageously engaging each of the lateral surfaces of the prism-shaped pressure element. Such a shape is particularly easy to realize, for instance, by an extrusion process.

Alternatively, the recess and the pressure element may each have the shape of a truncated pyramid, a semiconductor component resting against each lateral surface of the pressure element. Such a form has the advantage that, depending on the inclination angle of the lateral surfaces of the pyramid, a component of the clamping force exerted by the clamping device acts directly on the semiconductor components, while with the prismatic shape, only transverse forces created by the deformation of the pressure element come to bear.

The pressure element may alternatively consist of at least two wedges which can be moved relative to each other parallel to the walls of the recess. If the end faces of bases of the wedges are clamped together by the clamping element, the lateral surfaces are pushed apart and the semiconductor components are thereby pressed against the heat sink. With such wedges very high contact pressures can be realized.

The clamping element may comprise two clamping plates or discs, each resting against an end face of the pressure element, and a clamping screw connecting the two clamping discs.

In yet another embodiment of the clamping element, the heat sink is provided in its recess with a contact post for an end face of the pressure element, another end face of the pressure element engaging a circuit board to which the heat sink is bolted. In this case, the heat sink is fastened to the circuit board and the pressure element is simultaneously clamped.

DETAILED DESCRIPTION

Figure 1:
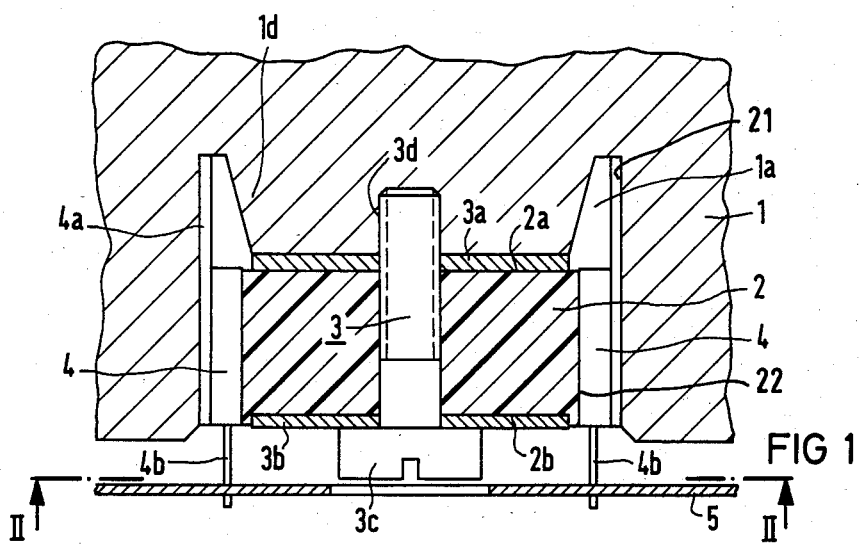
FIG. 1 is a partial cross-sectional view of a heat sink and a clamping device, in accordance with this invention, for pressing a plurality of semiconductor plates against the heat sink.

FIG. 1 shows a cross-sectional view of a heat sink 1 with a recess 1a. The recess 1a has the form of a regular right octagonal prism. On each lateral surface of the prism, i.e., on each longitudinally extending wall 21 of recess 1a, is disposed a semiconductor component 4, for instance, a plate-shaped transistor with an attached mounting tab 4a. The contacts 4b of the transistor protrude downward from recess 1a and are soldered to conductor runs of a circuit board 5.

The space between the transistors 4 is occupied by a pressure element 2 likewise in the form of regular right octagonal prism having longitudinally extending lateral surfaces 22 parallel to the walls 21 of recess 1a. Pressure element 2 consists of an elastically compressible material such as EPTM rubber. Every transistor 4 contacts an inside surface of heat sink 1, i.e., a wall 21 of recess 1a, and a lateral surface 22 of pressure element 2. On end faces or bases 2a and 2b of pressure element 2 are arranged respective clamping discs 3a and 3b, a screw 3c being brought centrally through clamping discs 3a and 3b as well as through pressure element 2. The end of screw 3c leads into a blind tapped hole 3d in an extension of 1d of heat sink 1 which protrudes into recess 1a. Upon the threading of screw 3c into heat sink extension 1d, clamping discs 3a and 3b exert a clamping force on end faces 2a and 2b, thereby compressing pressure element 2. Since the pressure element 2 is elastically compressible, it gives way laterally under the pressure on its faces 2a and 2b, i.e., surfaces 22 shift laterally outwardly and perpendicularly to the associated walls 21 of recess 1a and are pressed against the respective semiconductor components 4. Semiconductor components 4 are thereby pressed in turn against the inside surfaces 21 of heat sink 1. The transverse forces exerted by the pressure element 2 on the semiconductor components 4 are distributed uniformly over the surfaces thereof, thereof, so that the latter are pressed against the sink 1 uniformly. Moreover, dimensional tolerances of the transistors as well as of the entire clamping device are equalized. The manufacturing tolerances of the assembly device therefore need meet only very loose requirements, with the result, for example, that the heat sink 1 can be produced by extrusion without any mechanical reworking. The heat sink can be cut off from an extruded cooling section.

Heat sink 1 need not absolutely have a fastening of its own. Rather, it is held sufficiently for most applications via transistors 4 and transistor terminals 4b which are soldered to circuit board 5.

One terminal of each semiconductor component 4, for example, the collector, is generally connected to the housing of the semiconductor component. With a clamping device according to the present invention, the collectors of all the semiconductor components 4 are interconnected if no insulation is provided between the semiconductor components and the heat sink. If such a coupling is not desired because, for instance, the collectors are at different potentials, an insulating foil can be inserted between the semiconductor components 4 and the heat sink so that the semiconductors 4 are electrically insulated while maintaining a good heat-conducting contact with the sink.

Figure 2:
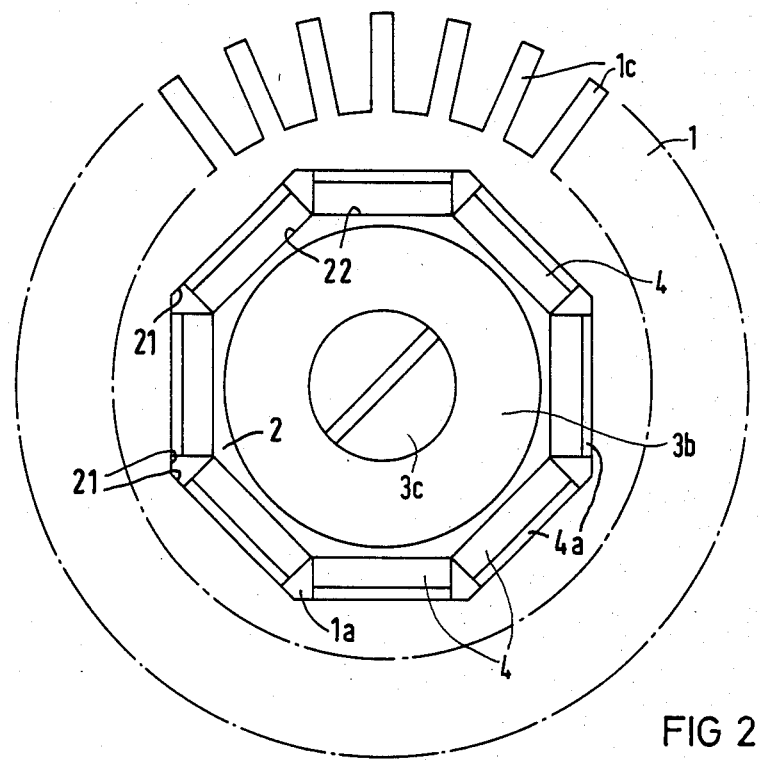
FIG. 2 is an elevational view taken along line II—II in FIG. 1.

As illustrated in FIG. 2, heat sink 1 has circular cross section and is provided with longitudinally extending external cooling fins 1c. The heat sink 1 is designed for air cooling with natural air circulation. However, the heat sink could just as well be provided with cooling canals, for instance, in the form of breakthroughs, through which water or a gaseous coolant flows. The clamping device shown can therefore be used for heat sinks with cooling by natural air circulation as well as for heat sinks with forced cooling by a cooling liquid of cooling gas. In any case, a very compact design is obtained by accomodating the semiconductor components in a recess of the heat sink. It is to be noted that in a heat sink with air cooling via cooling fins, the outside surface determining the heat removal is not reduced, although the semiconductor components are built into a recess. If the heat sink is provided with cooling canals, a very small distance between the cooling canals and the semiconductor components, and thereby very good heat transfer, can be achieved.

Figure 3:
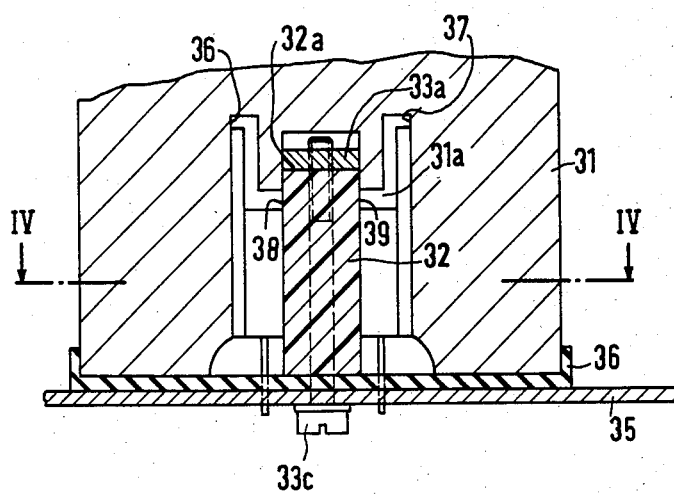
FIG. 3 is a vertically transverse partial cross-sectional view of a heat sink and another clamping device in accordance with this invention.
Figure 4:
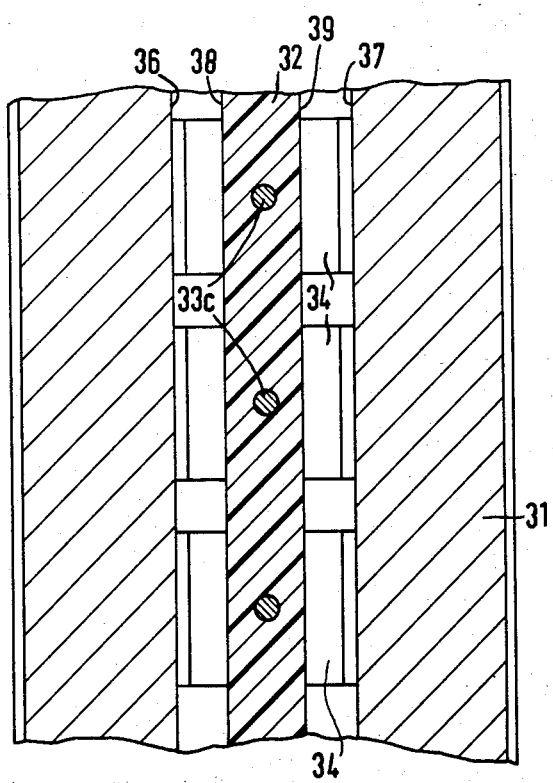
FIG. 4 is a horizontally transverse partial cross-sectional view taken along line IV—IV in FIG. 3.

Another embodiment of the invention is shown in FIGS. 3 and 4. The heat sink in this case is essentially in the form of a bar 31 with a slot-shaped recess 31a having a pair of longitudinally extending parallel walls 36 and 37 along which as many semiconductor components 34 as desired can be lined up. The clamping device in the embodiment of FIGS. 3 and 4 comprises a pressure element 32 in the form of an elongate right parallelepiped having a pair of parallel lateral surfaces 38 and 39 facing walls 36 and 37, respectively. In contrast to the design of FIG. 1, pressure element 32 is not bolted to a projection in the recess 31a of heat sink 31, but clamped by one or more clamping screws 33c between a circuit board 35 and a clamping disc 33a disposed on an end face 32a of pressure element 32 opposite circuit board 35. Pressure element 32 expands laterally when screw 33c is tightened and presses semiconductor or components 34 against walls 36 and 37 of recess 31a. Heat sink 31 is advantageously secured to circuit board 34 by screw 33c. Since the heat sink 31 is at the potential of a terminal of at least one of the semiconductor components 34, an insulator 36 is inserted between the circuit board 35 and heat sink 31.

Figure 5:
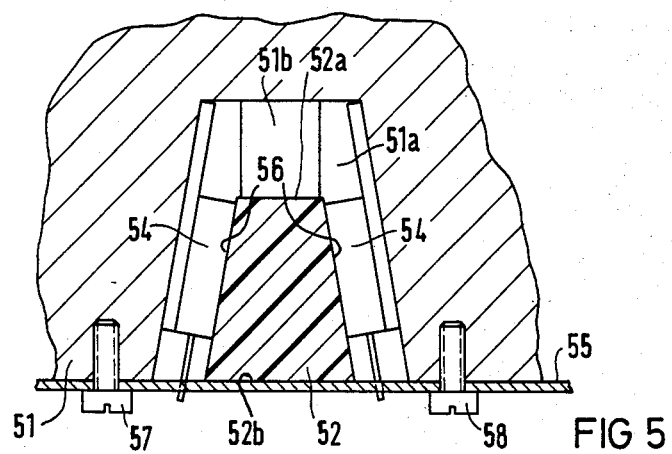
FIG. 5 is a partial longitudinal cross-sectional view of a heat sink and another clamping device in accordance with the present invention.

FIG. 5 shows a third embodiment of the present invention. Here, a recess 51a in a heat sink 51 and a pressure element 52 disposed in the recess each have the form of a truncated pyramid, a semiconductor component 54 being sandwiched between each lateral surface 56 of pressure element 52 and an associated wall of recess 51a. One end face 52a of pressure element 52 rests against a contact post 51b projecting into recess 51a from heat sink 51. Another end face 52b of pressure element 52 engages a circuit board 55, heat sink 51 being fastened to the circuit board by screws 57 and 58. In this case pressure element 52 is compressed between contact post or projection 51b and circuit board 55 upon tightening of screws 57 and 58. The laterally expanding pressure element then exerts a substantially transverse force on semiconductor component 54 and presses them against the walls of recess 51a. In this embodiment, however, a component of the clamping force exerted on pressure element 52 via the end faces 52a and 52b thereof acts directly on the semiconductor components 54, the magnitude of this component depending on the inclination of the sides of the truncated pyramid. Therefore, higher contact pressures can be obtained with the clamping device shown in FIG. 5. This clamping device, as well as the device illustrated in FIG. 3, has the further advantage that pressure element 52 is clamped to projection 51b by the same screws 57 and 58 that fasten heat sink 1 to circuit board 55.

Figure 6:
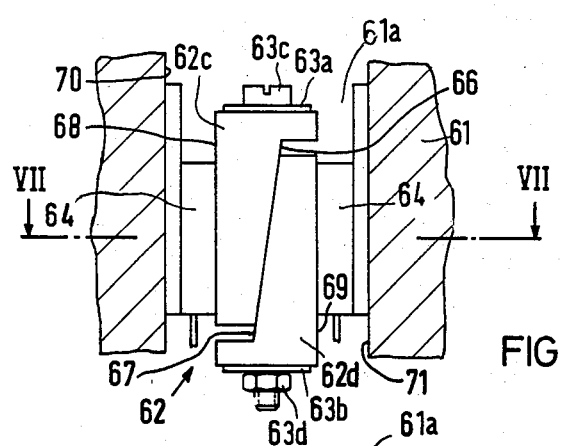
FIG. 6 is a partial longitudinal cross-sectional view, similar to FIGS. 3 and 5, of a heat sink and yet another clamping device in accordance with the present invention.
Figure 7:
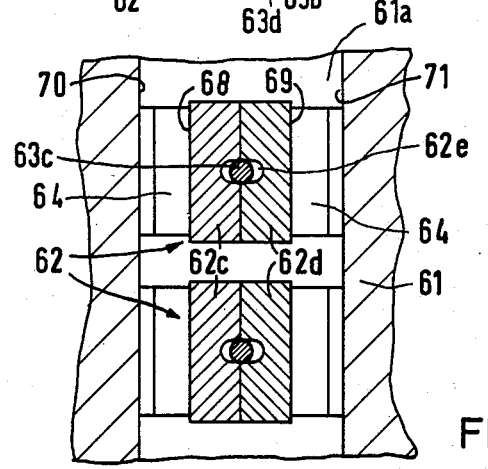
FIG. 7 is a partial transverse cross-sectional view taken along line VII—VII in FIG. 6.

A further embodiment of the present invention is shown in FIGS. 6 and 7. A pressure element 62 comprises a pair of wedges 62c and 62d, the inclinded surfaces 66 and 67 of which wedges engage each other so that lateral surfaces 68 and 69 of wedges 62c and 62d lie parallel to walls 70 and 71 of a slot-shaped recess 61a in a heat sink 61. Wedges 62c and 62d can be moved relative to each other in a direction parallel to walls 70 and 71 and each have a hole 62e with an oval cross section. In these holes 62e is disposed a screw 63c which, together with a nut 63d, serves as a clamping element. On the end faces or bases of wedges 62c and 62d, clamping discs or washers 63a and 63b are inserted. In order to obtain a clean contact for clamping washers 63a and 63b, wedges 62c and 62d are widened at their end faces. Several such clamping devices with semiconductor components 64 engaging both lateral contact surfaces 68 and 69 can be lined up in recess 61a of the heat sink 61. If screw 63c is tightened and wedges 63c and 63d consequently shifted relative to each other, lateral contact surfaces 68 and 69 of the wedges are pushed apart laterally toward and perpendicularly to the walls 70 and 71 of recess 61a and thereby press semiconductor components 64 against these walls. With this arrangement, a very high contact pressure for the semiconductor components 64 can be realized.

What is claimed is:

1. A device which clamps a plurality of plate-shaped semiconductor components to a heat sink provided with a recess having a plurality of walls formed by respective inner surfaces of the heat sink, comprising:
    a pressure element having a plurality of lateral contact surfaces and a pair of transverse end faces, each lateral contact surface being oriented parallel to an associated wall of said recess, said pressure element consisting of elastically compressible material, and
    pressure application means engageable with said end faces and exerting a clamping force thereon to compress said pressure element, each semiconductor component being disposed between one of said lateral contact surfaces and the associated wall of said recess, each semiconductor component having a planar face substantially entirely in contact with the respective lateral contact surface of said pressure element, each of said lateral contact surfaces being shiftable laterally outwardly and substantially perpendicularly to the associated wall of said recess upon an application of said clamping force to said end faces, whereby said semiconductor components are clamped to said heat sink.

2. The device defined in claim 1 wherein said recess and said pressure element are each in the form of a right prism, a semiconductor component engaging each of said lateral contact surfaces.

3. The device defined in claim 2 wherein said pressure application means includes a pair of clamping discs each engaging a respective end face of said pressure element, said pressure application means further including a clamping screw.

4. The device defined in claim 1 wherein said pressure application means includes a contact post projecting from said heat sink into said recess at an inner end thereof and further includes a circuit board to which said heat sink is secured, one end face of said pressure element engaging said contact post and the other end face engaging said circuit board.

5. The device defined in claim 1 wherein said recess and said pressure element are each in the form of a truncated pyramid, a semiconductor component engaging each of said lateral contact surfaces.

6. The device defined in claim 5 wherein said pressure application means includes a contact post projecting from said heat sink into said recess at an inner end thereof and further includes a circuit board to which said heat sink is secured, one end face of said pressure element engaging said contact post and the other end face engaging said circuit board.

* * * * *